US007745941B2

(12) United States Patent
Kuroda et al.

(10) Patent No.: US 7,745,941 B2
(45) Date of Patent: Jun. 29, 2010

(54) SEMICONDUCTOR DEVICE HAVING SHIFTED STACKED CHIPS

(75) Inventors: Hiroshi Kuroda, Tokyo (JP); Katsuhiko Hashizume, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 79 days.

(21) Appl. No.: 11/734,973

(22) Filed: Apr. 13, 2007

(65) Prior Publication Data

US 2007/0262431 A1    Nov. 15, 2007

(30) Foreign Application Priority Data

May 12, 2006  (JP) .............................. 2006-133680

(51) Int. Cl.
*H01L 23/48* (2006.01)
*H01L 23/52* (2006.01)
*H01L 29/40* (2006.01)

(52) U.S. Cl. ........................ 257/777; 257/678; 257/778; 257/782; 257/786; 257/784; 257/773; 257/692; 257/748; 257/459

(58) Field of Classification Search ................. 257/777, 257/678, 773, 778, 786, 784, 692, 748, 459, 257/782
See application file for complete search history.

(56) References Cited

U.S. PATENT DOCUMENTS 5,323,060 A * 6/1994 Fogal et al. .................. 257/777
6,476,500 B2   11/2002 Kimura

FOREIGN PATENT DOCUMENTS

JP         2002-43503         2/2002

* cited by examiner

*Primary Examiner*—Kenneth A Parker
*Assistant Examiner*—David Z Chen
(74) *Attorney, Agent, or Firm*—Mattingly & Malur, P.C.

(57) ABSTRACT

A first semiconductor chip and a second semiconductor chip which form a stack are mounted on a module substrate by deflecting a center position of the semiconductor chips from the module substrate. In the side where the distance from the edge of the deflected semiconductor chip to the edge of a module substrate is shorter, the electrode pad on the first semiconductor chip and the electrode pad on the second semiconductor chip are directly connected with a wire. In the side where the distance from the edge of the deflected semiconductor chip to the edge of a module substrate is longer, the electrode pad on the first semiconductor chip and the electrode pad on the second semiconductor chip are combined with the corresponding bonding lead on the module substrate with a wire.

5 Claims, 9 Drawing Sheets

SEMICONDUCTOR DEVICE HAVING SHIFTED STACKED CHIPS

CROSS-REFERENCE TO RELATED APPLICATION

The present application claims priority from Japanese patent application No. 2006-133680 filed on May 12, 2006, the content of which is hereby incorporated by reference into this application.

FIELD OF THE INVENTION

The present invention relates to the semiconductor device of the system in package (SIP) of the stack structure which accumulated and stored two semiconductor chips in one package.

DESCRIPTION OF THE BACKGROUND ART

In SIP which did the stack of the two semiconductor chips, module terminals, such as a ball grid array (BGA), are arranged in the back surface of a module substrate. On the surface of a module substrate, the bonding lead combined with a module terminal is formed. The corresponding electrode pad of two semiconductor chips by which the stack was done is connected to a bonding lead with a wire. When many electrode pads are arranged along the side of the same side of both semiconductor chips, the bonding leads to which they are connected are arranged along one side of a module substrate at two rows in front and back. For example, the bonding lead of the front row is connected to the electrode pad of the semiconductor chip arranged downward with a wire, and the bonding lead in the back row is connected to the electrode pad of the semiconductor chip arranged upwards with a wire. In Patent Reference 1, as such a configuration of connection, since it is a problem that the wire contacts a semiconductor chip and other wires, when connecting the electrode pad of an upper semiconductor chip to a corresponding bonding lead directly, and the connection wire becomes long, the structure that a relay terminal is formed in a lower semiconductor chip, a wire was connected to the relay terminal from the electrode pad of the upper semiconductor chip, and the wire was connected to the corresponding bonding lead from the relay terminal is shown as a connection with the corresponding bonding lead from the electrode pad of the upper semiconductor chip. Especially in Patent Reference 1, since the size of the semiconductor chip which is stacked upward is restricted with the structure which arranges a relay terminal to both sides of the lower semiconductor chip by which the stack was done, the structure which loses one relay terminal, makes it deflect to the side which lost the relay terminal, and does the stack of another semiconductor chip on it is proposed. By bringing the upper semiconductor chip close to the border portion of a lower semiconductor chip, and deflecting it, the wire which connects the electrode pad of the upper semiconductor chip to the bonding lead of the module substrate can be made short to the degree which can link directly at the side brought close. As a result, it is supposed that a relay terminal can be excluded from the one-side side of the semiconductor chip which is stacked downward, and the miniaturization of the semiconductor chip which is stacked downward is realizable.

[Patent Reference 1] Japanese Unexamined Patent Publication No. 2002-43503

SUMMARY OF THE INVENTION

Regarding the electrode pad which may be directly connected on a function like the electrode pad which forms the address output terminal of a memory controller, and the electrode pad which forms the address input terminal of a memory, the structure which connects each electrode pad to a bonding lead, and combines a corresponding bonding lead with the wiring in a module substrate is employable. Even if it is an electrode pad which may be directly connected on a function, it is for coping with the case where the arrangement has not gared mutually.

However, when the number of bonding leads then increased, for example, the stack of the semiconductor chip is done to two stages, the bonding lead row corresponding to the semiconductor chip of the first stage and the bonding lead row corresponding to the semiconductor chip by which the stack was done to the second stage will be arranged at two rows at right and left (or circumference) of a semiconductor chip, respectively, and it becomes difficult to miniaturize a module substrate. The technology of Patent Reference 1 tends to make size of a lower semiconductor chip small by deflecting the upper semiconductor chip to the lower semiconductor chip by which the stack was done, and arranging. There is no suggestion regarding miniaturizing a module substrate in respect of the interconnection between the electrode pads which may be directly connected on a signal input output function.

When making flip chip connection of the semiconductor chip of the first stage so that the front surface (electrode pad formation surface) may face with the front surface (bonding lead formation surface) of a module substrate, since a plurality of bonding leads corresponding to the electrode pad of the semiconductor chip of the first stage can arrange not under the circumference of a semiconductor chip but under the back surface of a semiconductor chip, the miniaturization of a module substrate is possible. However, when flip chip connection is applied, compared with a wire-bonding method, a manufacturing cost will become high.

Then, the present inventor examined linking such an electrode pad directly, when arrangement of the electrode pad which may be directly connected on a function had gared to some extent between the semiconductor chips by which the stack was done. By linking directly, it is because the number of the bonding leads on a module substrate can be reduced, and the wiring which connects between corresponding bonding leads within a module substrate can be made unnecessary and it can contribute to the simplification of a module substrate. However, even if it can reduce the number of bonding leads, if the open area by it was distributing on the module substrate, it cannot contribute to the miniaturization of a module substrate.

A purpose of the present invention is to offer the semiconductor device which can contribute to the miniaturization of a module substrate regarding the point of the interconnection between the electrode pads which may be directly connected on a function.

A purpose of the present invention is to offer the technology in which the manufacturing cost of a semiconductor device can be reduced.

The above-described and the other purposes and novel features of the present invention will become apparent from the description herein and accompanying drawings.

Of the inventions disclosed in the present application, typical ones will next be summarized briefly.

[1] The semiconductor device (4) concerning the present invention has a module substrate (3), a first semiconductor chip (1), and a second semiconductor chip (2). The module substrate includes a plurality of first bonding leads (303) arranged along a first side (301), a plurality of second bonding leads (302) arranged along the first side spacing out approaching to the first side concerned rar than the first bonding lead, and a plurality of third bonding leads (307) arranged along a second side (306) opposite to the first side. The first semiconductor chip includes an integrated first circuit, a plurality of first electrode pads (101) arranged along a third side (100) and coupled to the first circuit, and a plurality of second electrode pads (105) arranged along a fourth side (104) opposite to the third side, and coupled to the first circuit, and is mounted over the module substrate. The second semiconductor chip includes an integrated second circuit, a plurality of third electrode pads (201) arranged along a fifth side (200) and coupled to the second circuit, and a plurality of fourth electrode pads (205) arranged along a sixth side (204) opposite to the fifth side, and coupled to the second circuit, and is mounted over the first semiconductor chip. The first bonding lead and the first electrode pad which correspond, respectively are electrically connected by a first wire (502). The second bonding lead and the third electrode pad which correspond, respectively are electrically connected by a second wire (501). The third bonding lead and the second electrode pad which correspond, respectively are electrically connected by a third wire (507). The second electrode pad and the fourth electrode pad which correspond, respectively are electrically connected by a fourth wire (500). The third side and the fifth side are arranged approaching to the first side, the fourth side and the sixth side are arranged approaching to the second side, and a gap of the first side and the third side is larger than a gap of the second side and the fourth side.

According to the above-mentioned means, the second electrode pad and the fourth electrode pad which are directly connected with the fourth wire are collected by the border portions of the same side of the first semiconductor chip and the second semiconductor chip. From a plurality of bonding leads arranged along the second side (306) of the module substrate, the bonding lead for connecting the second electrode pad and the fourth electrode pad can be abolished. Therefore, it becomes possible to reduce the number of bonding leads concentrating on the part. The open area obtained by direct connection is concentrated to the second side of a module substrate without distribution. As a result, the bonding leads arranged along the second side become possible to put together from plural lines to one row. Since the first and the second semiconductor chip are arranged deflecting and approaching to the second side, a big leeway in space is made at the first side of the module substrate, and it becomes easy to arrange much bonding leads. It can contribute to realization of the manufacture facilitation of a module substrate, and a miniaturization of a module substrate. Temporarily, if the first and the second semiconductor chip are not deflected to the second side of the module substrate, at the first side of the module substrate, much bonding leads must be arranged with relatively high density, and the wiring in a module must be formed. Therefore, manufacture of a module substrate becomes difficult and the miniaturization is restricted.

Since each of the first and a second semiconductor chip electrically connects with a plurality of bonding leads formed on the module substrate via a plurality of bonding wires, it can reduce the manufacturing cost of a semiconductor device.

As one concrete form of the present invention, the gap of the third side and a fifth side and the gap of the fourth side and a sixth side are made equal. About the stack of a first semiconductor chip and the second semiconductor chip, like the conventional technique, the chip center can be adjusted and the stack can be done easily.

As another concrete form of the present invention, as for the second electrode pad and the fourth electrode pad which share the fourth wire, one side is an output terminal and the other side is an input terminal mutually. It is set as the typical interrelation of a direct connection terminal between different semiconductor chips.

As another concrete form of the present invention, the number of the third bonding leads is less than the number of the first bonding leads. The space margin at the side of the first side of a module substrate can be enlarged further.

[2] The semiconductor device (4) concerning the present invention has a module substrate (3), a first semiconductor chip (1) mounted over the module substrate deflecting a centre position mutually right and left to the module substrate concerned, and in which a first circuit was integrated, and a second semiconductor chip (2) mounted over the first semiconductor chip and in which a second circuit was integrated. In a side where a distance from an edge of the deflected first semiconductor chip to an edge of the module substrate is shorter, an electrode pad (105) over the first semiconductor chip and an electrode pad (20) over the second semiconductor chip corresponding mutually are directly connected with a wire (500). In a side where a distance from an edge of the deflected first semiconductor chip to an edge of the module substrate is longer, an electrode pad (101) over the first semiconductor chip and an electrode pad (201) over the second semiconductor chip are connected to a corresponding bonding lead (303, 302) over the module substrate with a wire (502, 501).

According to the above-mentioned means, on a module substrate, since the semiconductor chip is deflected to the side by which the electrode pad directly connected with the wire has been arranged, a big leeway in space is given in the opposite side of a semiconductor chip on a module substrate. It becomes easy to arrange many bonding leads and it can contribute to realization of the manufacture facilitation of a module substrate, and a miniaturization of a module substrate.

As one concrete form of the present invention, in the side where the distance from the edge of the deflected first semiconductor chip to the edge of a module substrate is shorter, the electrode pad on the first semiconductor chip and the bonding lead on the module substrate corresponding mutually are combined with a wire. Flexibility increases in the meaning that it is not needed to assign all to direct connection with the electrode pad of the first semiconductor chip, and the electrode pad of the second semiconductor chip in the side where the distance from the edge of the deflected first semiconductor chip to the edge of a module substrate is shorter.

Advantages achieved by some of the most typical aspects of the invention disclosed in the present application will be briefly described below.

That is, the module substrate of a semiconductor device can be miniaturized regarding the point of the interconnection between the electrode pads which may be directly connected on a function.

The manufacturing cost of a semiconductor device can be reduced.

DETAILED DESCRIPTION OF THE PREFERRED EMBODIMENTS

Figure 1:
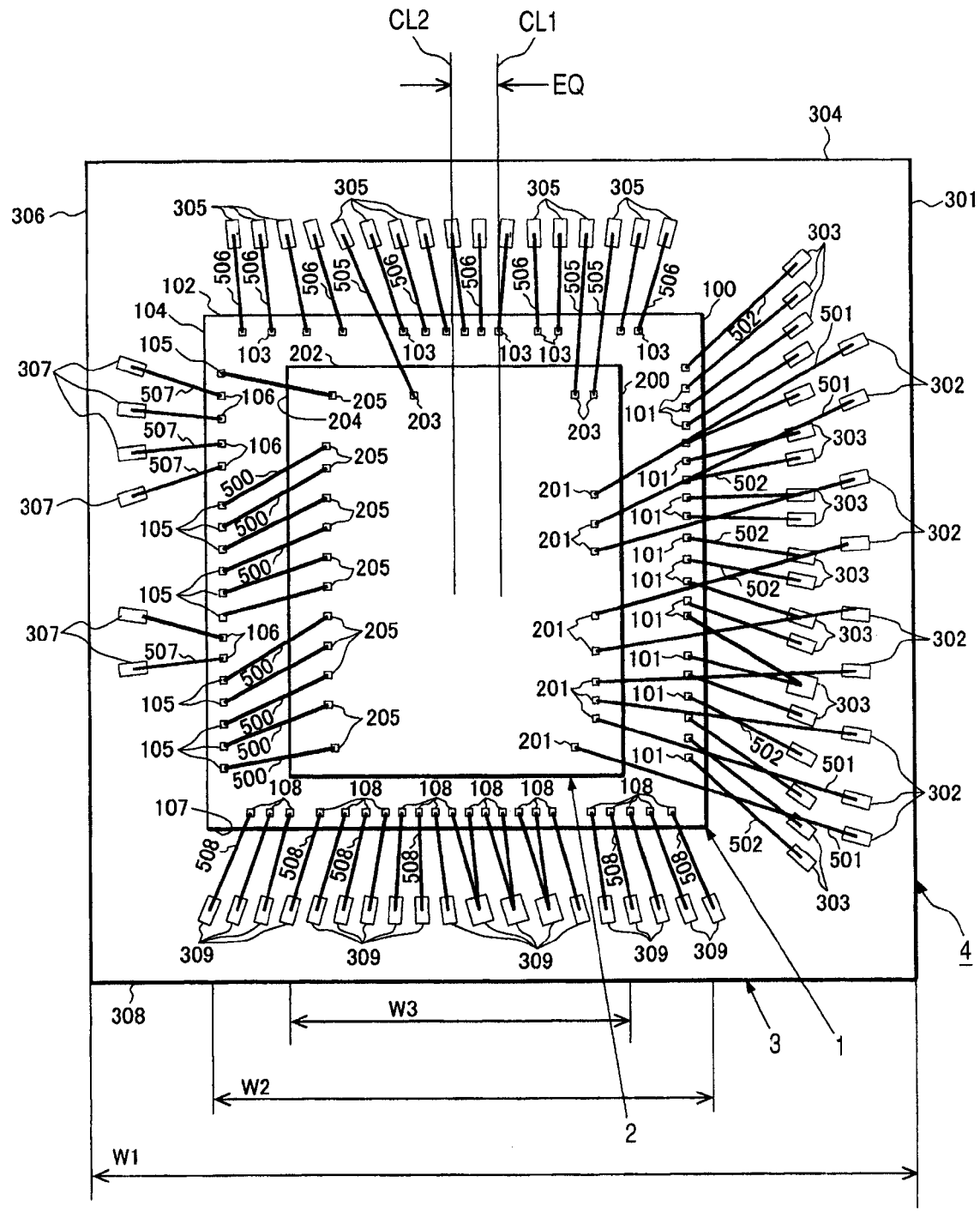
FIG. 1 is a plan view showing an example of the semiconductor device concerning the present invention.

An example of the semiconductor device concerning the present invention is shown in FIG. 1 in plan view. Semiconductor device 4 shown in the same drawing has the SIP structure formed by doing the stack of first semiconductor chip 1 and the second semiconductor chip 2 to module substrate (wiring substrate) 3.

Second semiconductor chip 2 is a driver which outputs driver voltage to a CCD camera, and first semiconductor chip 1 is a timing controller which generates the timing control signal which controls operation of a CCD camera. A driver inputs a part of timing control signal which a timing controller generates, and supplies a driving signal to a CCD camera.

Second semiconductor chip 2 of the rectangle by which the stack was done on the first semiconductor chip of a rectangle has a plurality of electrode pads (third electrode pad) 201 arranged along side (fifth side) 200, has a plurality of electrode pads 203 arranged along side 202, and has a plurality of electrode pads (fourth electrode pad) 205 arranged along side (sixth side) 204. Electrode pad 205 interfaces with first semiconductor chip 1, and the function, for example, which inputs a timing control signal or outputs a reply signal is assigned. Although illustration in particular is not done, second semiconductor chip 2 is provided with a voltage generating circuit, an output circuit, etc. as an internal circuit (second circuit) for realizing the function. The electrode pads 201, 203, and 205 are combined with the predetermined node of the internal circuit formed in the inside of semiconductor chip 2 via the wiring layer.

Rectangular first semiconductor chip 1 has a plurality of electrode pads (first electrode pad) 101 arranged along side (third side) 100, has a plurality of electrode pads 103 arranged along side 102, has a plurality of electrode pads (second electrode pad) 105,106 arranged along side (fourth side) 104, and has a plurality of electrode pads 108 along side 107. Electrode pad 105 is combined with corresponding electrode pad 205 of second semiconductor chip 2 by bonding wire (fourth wire) 500. Although illustration in particular is not done, first semiconductor chip 1 is provided with the sequencer for timing control or a program control circuit, a peripheral circuit, etc. as an internal circuit (first circuit) for realizing the function. The electrode pads 101, 103, 105, 106, and 108 are combined with the predetermined node of the internal circuit formed in the inside of semiconductor chip 2 via the wiring layer. Although not restricted in particular, the first semiconductor chip has an input/output interface circuit (for example, analog-digital-conversion circuit) of an analog signal. The electrode pad connected to the analog I/O interface circuitry concerned is collected by electrode pad 108 which went along side 107 in order to avoid mixture with a digital signal as much as possible.

Module substrate 3 is formed by the rectangular wiring substrate made of glass epoxy resin which has a wiring layer, for example. In a back surface, many ball electrodes are arranged in the shape of an array. Two rows of a plurality of bonding leads (second bonding lead) 302 and a plurality of bonding leads (first bonding lead) 303 are formed in a front surface from an outside along side (first side) 301. One row of a plurality of bonding leads 305 which went along side 304, one row of a plurality of bonding leads (third bonding lead) 307 which went along side (second side) 306, and one row of a plurality of bonding leads 309 that went along side 308 are formed. The bonding lead 302 is combined with electrode pad 201 of second semiconductor chip 2 by bonding wire (second wire) 501. The bonding lead 303 is combined with electrode pad 101 of first semiconductor chip 1 by bonding wire (first wire) 502. The bonding lead 305 is combined with corresponding electrode pad 203 of second semiconductor chip 2 by bonding wire 505, and is combined with corresponding electrode pad 103 of first semiconductor chip 1 by bonding wire 506. The bonding lead 307 is combined with electrode pad 106 of first semiconductor chip 1 by bonding wire (third wire) 507. The bonding lead 309 is combined with electrode pad 108 of first semiconductor chip 1 by bonding wire 508. Although illustration in particular is not done, each bonding lead 302,305,307,309 is connected to the corresponding ball electrode via the through hole or the wiring. The first semiconductor chip 1, second semiconductor chip 2, and bonding wires 500, 501, 502, 505, 506, 507, and 508 are sealed and protected by resin on the front surface of module substrate 3.

Figure 2:
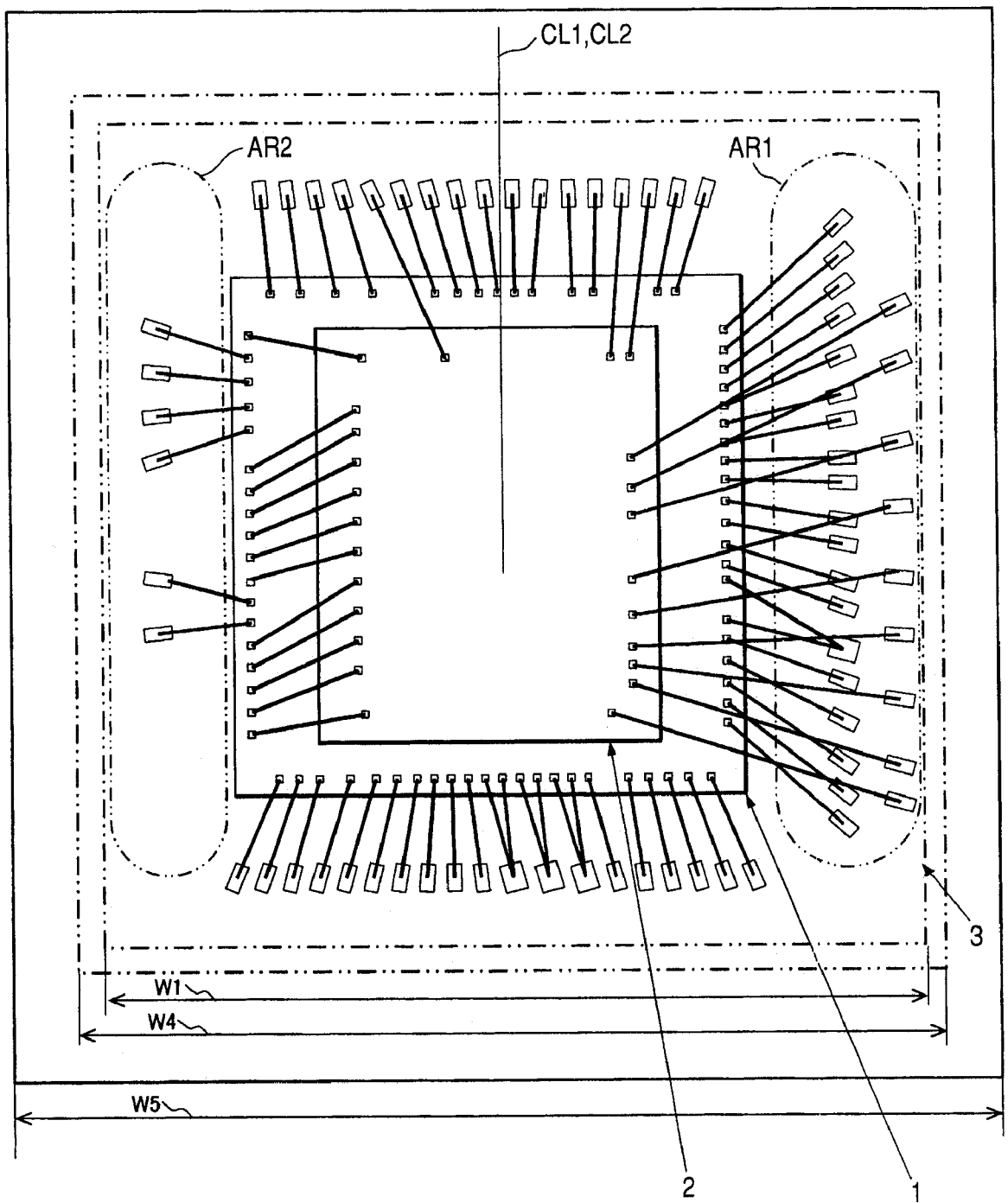
FIG. 2 is a plan view showing the semiconductor device concerning the first comparative example that did the stack without deflecting a semiconductor chip to a module substrate.

CL 1 is a central line of module substrate 3, and CL 2 is a central line of semiconductor chips 1 and 2. As clearly from a drawing, semiconductor chips 1 and 2 adjust the central line, and the stack is done. The stack of the semiconductor chips 1 and 2 by which the stack was done is deflected (gets eccentric) to left-hand side to central line CL 1 of module substrate 4. The amount of deflections is EQ. Since it is required for an adjacent wire not to contact in wire bonding, a prescribed minimum pitch must be secured between adjoining bonding leads. Therefore, by making left-hand side deflect semiconductor chips 1 and 2 by which the stack was done to central line CL 1 of module substrate 4, and doing a stack, a space margin is born to the region which must arrange bonding leads 302, 303 by two rows on module substrate 3 to which the arranging space was restricted. A useless open area cannot be generated in the region which should just arrange one row of bonding leads 307 in the opposite side, but it can contribute to realization of a miniaturization of module substrate 3 as a result. Like the first comparative example shown in FIG. 2, when the stack of central line CL 1 of module substrate 3 and central line CL 2 of semiconductor chips 1 and 2 is adjusted and done, as for regions AR1 and AR2 of right and left of semiconductor chip 1 on module substrate 3, area will become the same. It becomes impossible substantially to form a module substrate by arranging the bonding lead of two rows to region AR1, and the module substrate must be formed by width W4 (W1<W4) at least. It is difficult to adopt the module substrate of optional size by the relation with cost or standardization in practice. When there is no W4 in the standardized module substrate size, the module substrate size of bigger size W5 than it must be adopted, and there is a possibility of generating the big futility also in area and also in cost. When making the width size of the first semiconductor chip 1 into W2=3.68 mm and making the width size of second semiconductor chip 2 into W3=2.4 mm, concerning the size of semiconductor device 4 of FIG. 1, by making the amount of deflections into EQ=0.32 mm, module substrate 3 of width size W1=6 mm was employable. On the other hand, in the case of the comparative example of FIG. 2, it is necessary to adopt the module substrate of for example, width size W5=8 mm.

Figure 3:
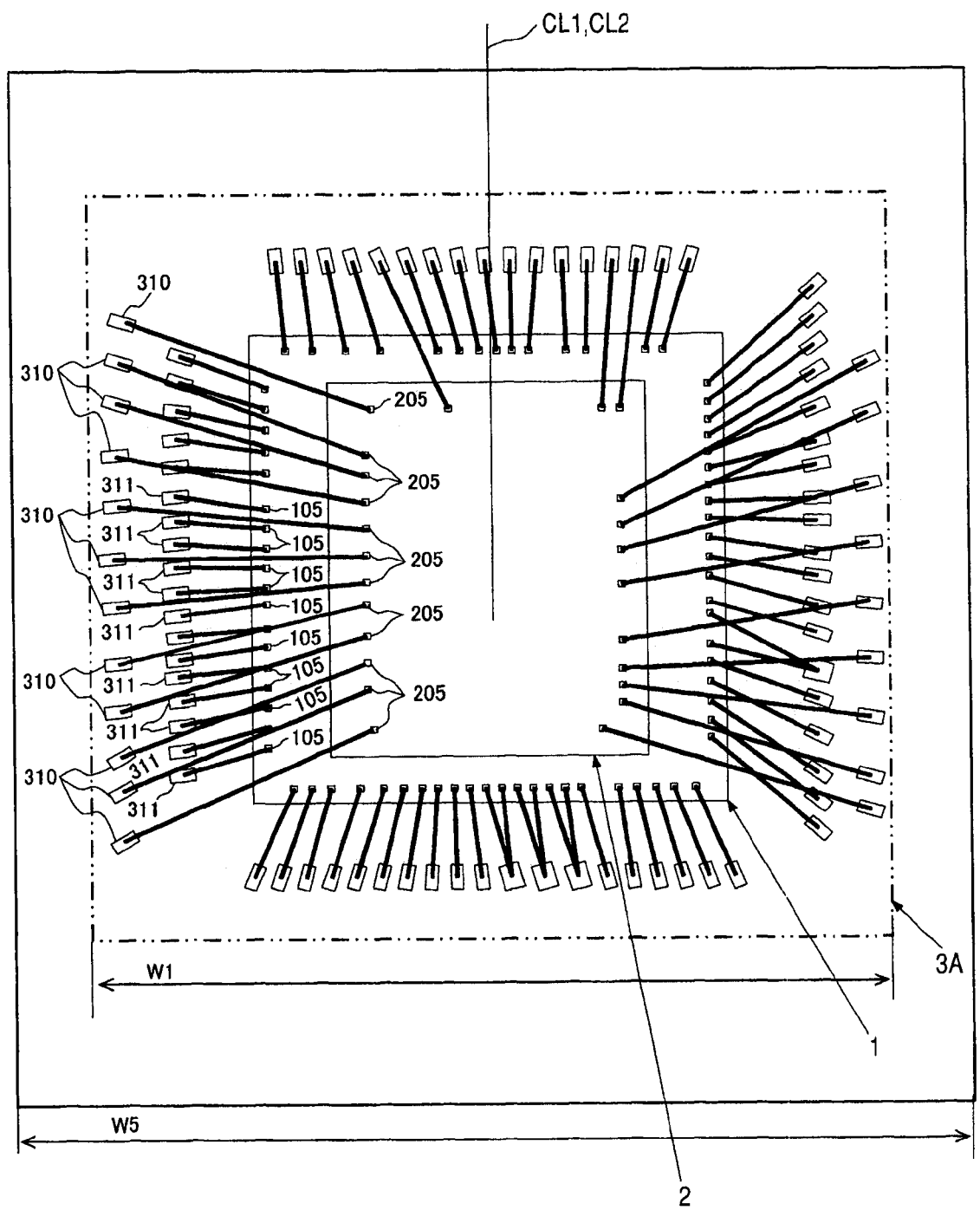
FIG. 3 is a plan view showing the semiconductor device concerning the second comparative example that connected individually to the bonding lead of a module substrate the electrode pad in which direct connection on a function is possible between the semiconductor devices by which the stack was done, and connected these corresponding bonding lead mutually using the wiring in the module substrate.

In the example of FIG. 1, as for electrode pad 105 of first semiconductor chip 1 and electrode pad 205 of second semiconductor chip 2, one side is an output terminal and the other side is an input terminal mutually, and they are terminals in which direct connection on a function is possible. In FIG. 1, it is set as the arrangement which can be directly connected with wire 500 by collecting those electrode pads 105, 205 of each semiconductor chip 1 and 2 so that they may come to the side (in the present invention for example, the second side of a module substrate) of the same side as mutual. In not paying the consideration which links electrode pad 105 of first semiconductor chip 1, and electrode pad 205 of second semiconductor chip 2 directly, as shown in the second comparative example of FIG. 3, electrode pad 105 of first semiconductor chip 1 and electrode pad 205 of second semiconductor chip 2 must be individually combined with corresponding bonding leads 311, 310 with a wire, respectively. The wiring in a module which connects bonding leads 310 and 311 by corresponding things must be formed in a module substrate. In the case of FIG. 3, the wiring in module substrate 3A must not only become complicated, but it must arrange two rows of bonding leads to each of right and left of module substrate 3A. Therefore, the module substrate of big size like W5 must be adopted like the comparative example of FIG. 2. As clearly from the comparative example of FIG. 2 and FIG. 3, it stops in the structure of FIG. 2 only by paying consideration of linking directly electrode pads 105, 205 in which direct connection on a function is possible with wire. 500 between different semiconductor chips 1 and 2, and it is occasionally difficult to adopt a module substrate with small size. It becomes possible to adopt a module substrate with small size for the first time by taking a means to deflect mutually a module substrate, and semiconductor chips 1 and 2 by which the stack was done, to make right and left deflect a centre position, and to accumulate them, as further step.

Figure 4:
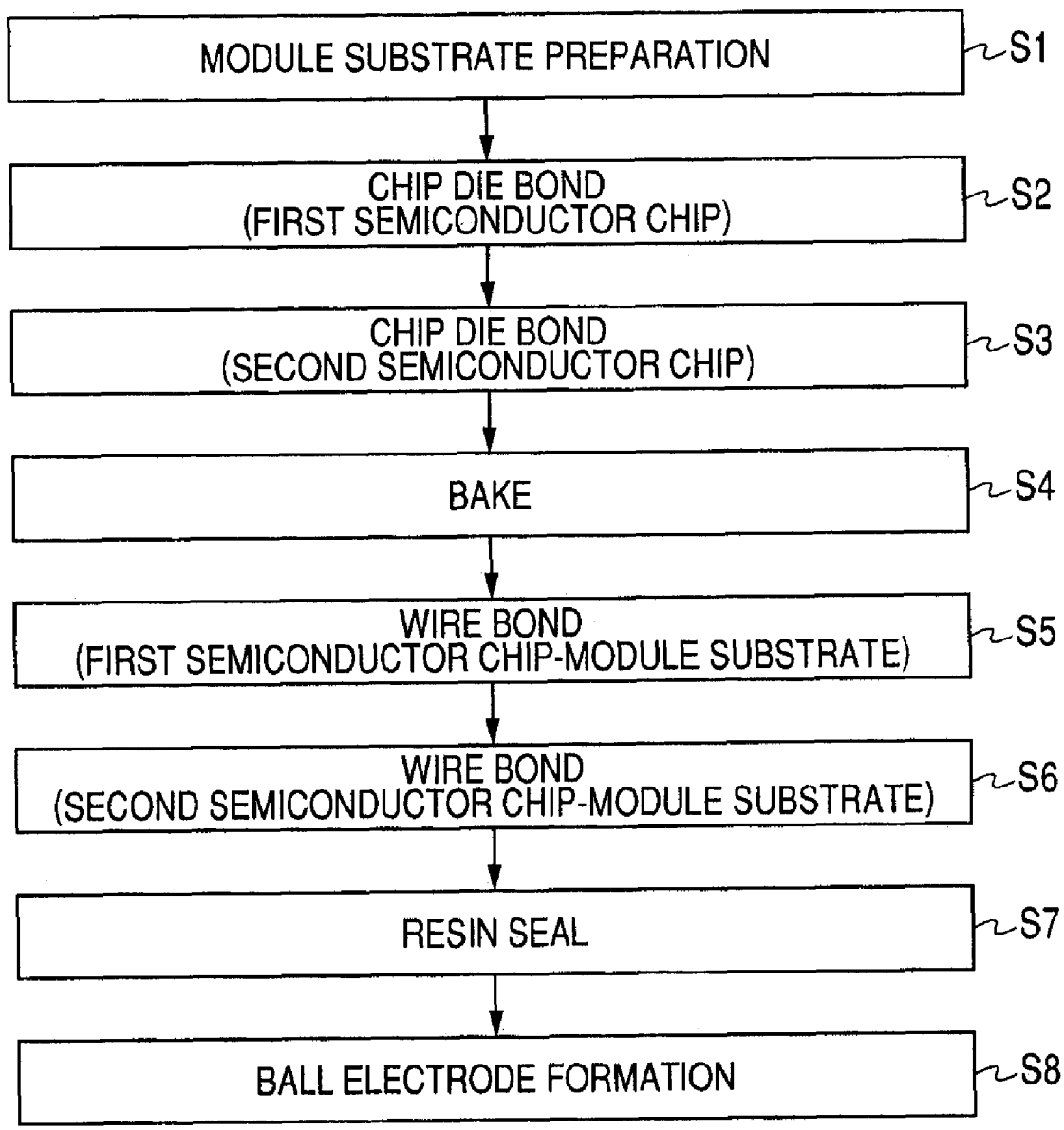
FIG. 4 is a flow chart which shows the manufacturing process of the semiconductor device of the present invention.

Next, the manufacturing method of semiconductor device 4 of the present invention is explained along the flow chart shown in FIG. 4.

Figure 5:
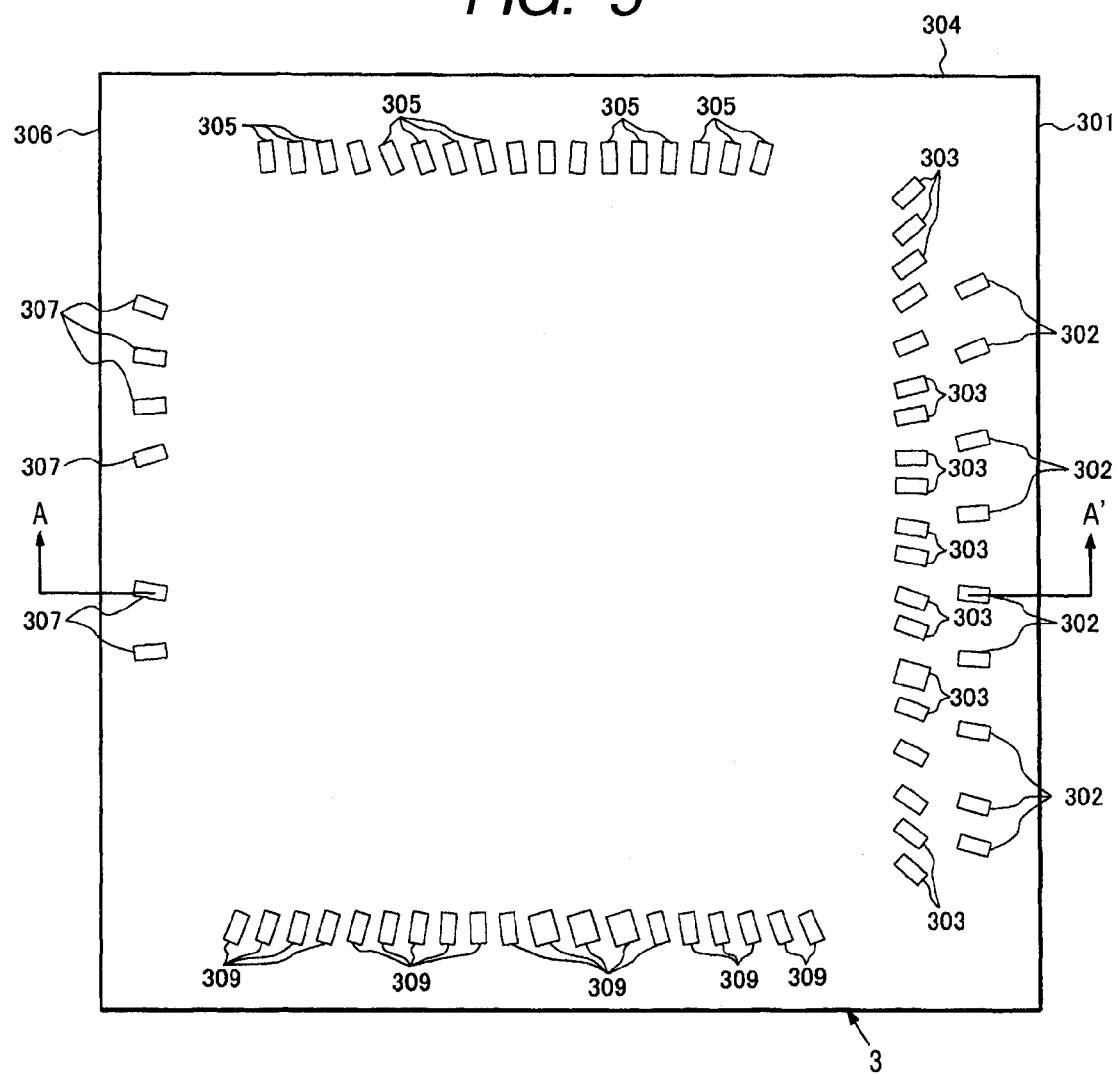
FIG. 5 is a schematic plan view of the module substrate of the present invention.
Figure 6:
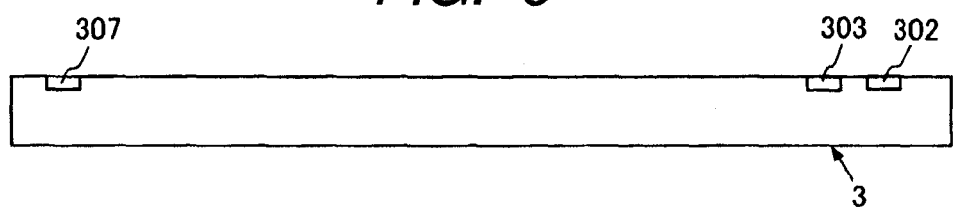
FIG. 6 is a schematic cross-sectional view which goes along the A-A' line of FIG. 5.

First, at Step S1 of FIG. 4, module substrate 3 shown in FIG. 5 and FIG. 6 is prepared. As for module substrate 3, a plurality of bonding leads 302, 303, 305, 307, 309 are formed along a plurality of sides 301, 304, 306, 308 on the front surface (main surface), respectively.

Figure 7:
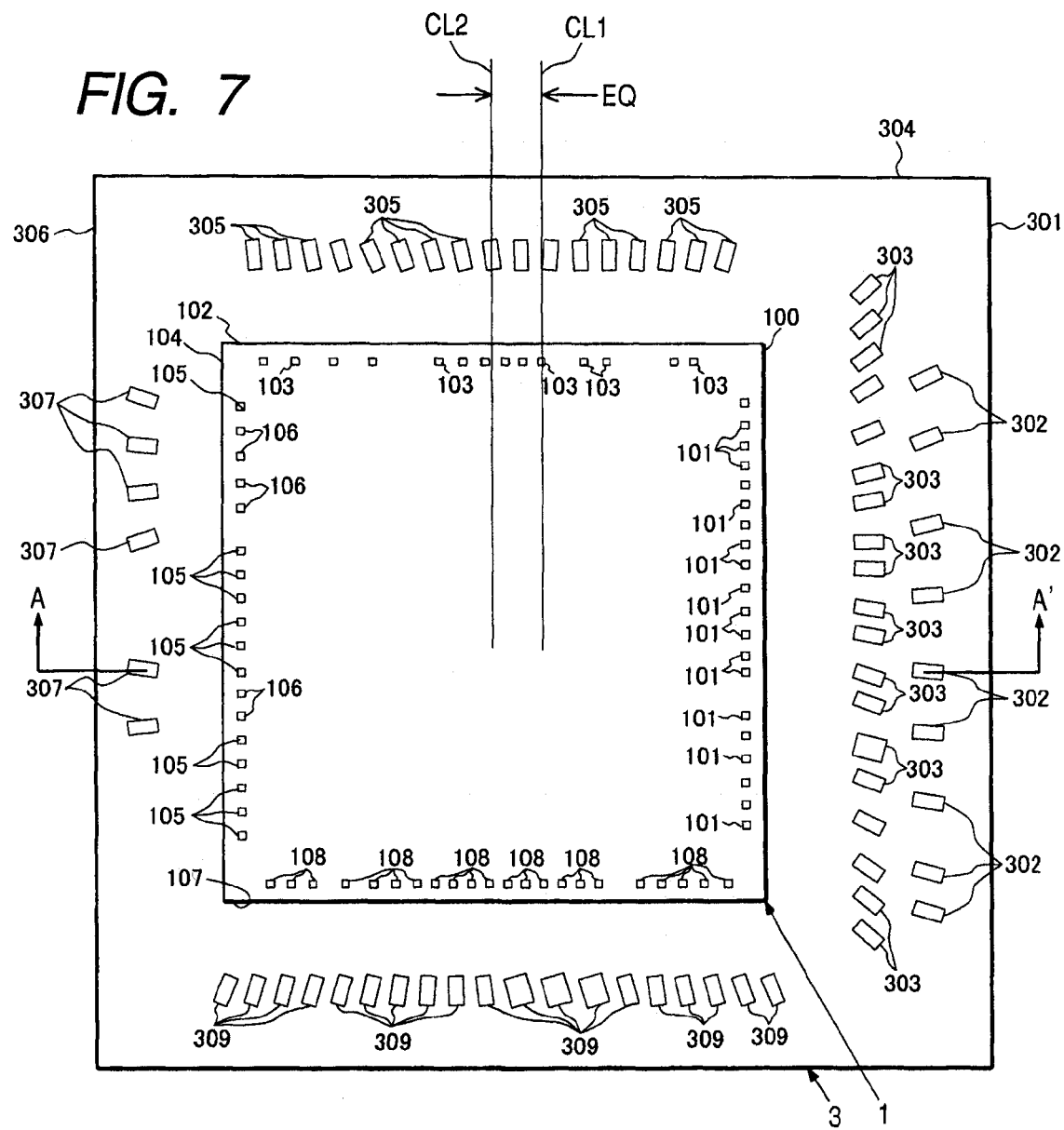
FIG. 7 is the schematic plan view which mounted the first semiconductor chip on the module substrate.
Figure 8:
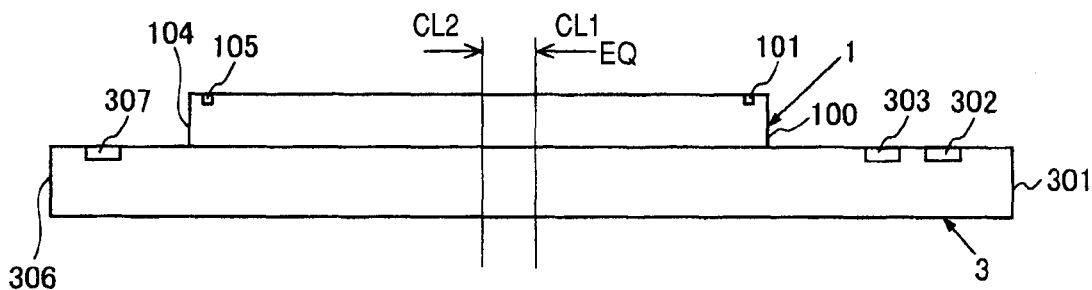
FIG. 8 is a schematic cross-sectional view which goes along the A-A' line of FIG. 7.

Next, at Step S2 of FIG. 4, as shown in FIG. 7 and FIG. 8, first semiconductor chip 1 is mounted via a binder (not shown) on the front surface of module substrate 3. The integrated internal circuit (first circuit) is formed in the main surface of first semiconductor chip 1. A plurality of electrode pads 101, 103, 105, 106, and 108 electrically connected with the internal circuit via the wiring layer are formed, respectively along a plurality of sides 100, 102, 104, and 107 of first semiconductor chip 1. First semiconductor chip 1 is mounted in the position where the central line CL 2 shifted from central line CL 1 of the module substrate. Namely, first semiconductor chip 1 is mounted deflecting central line CL 2 of first semiconductor chip 1 to the second side of module substrate 3 so that the gap of first side 301 of module substrate 3, and third side 100 of first semiconductor chip 1 may become larger than the gap of second side 306 of module substrate 3, and fourth side 104 of first semiconductor chip 1.

Figure 9:
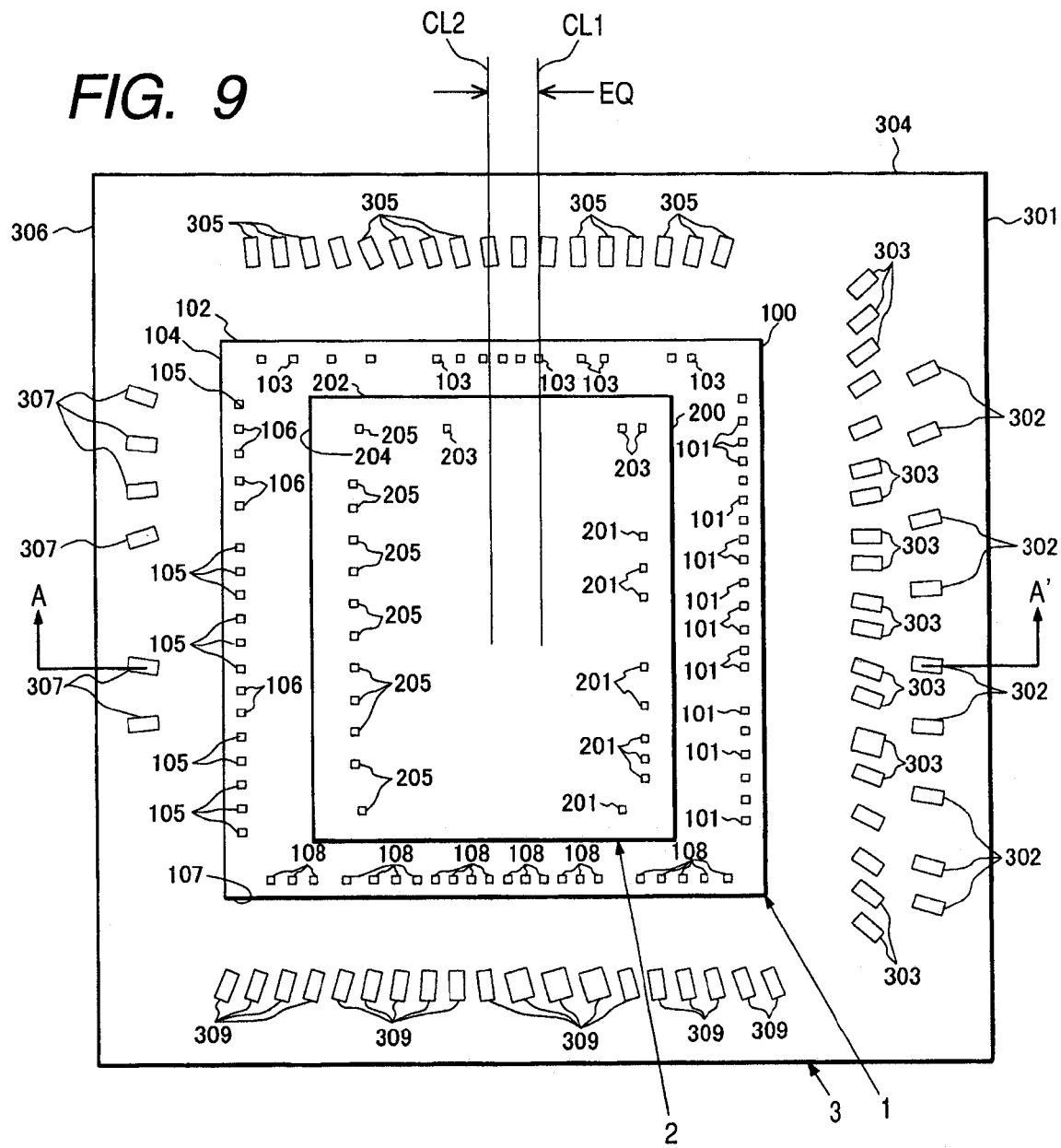
FIG. 9 is the schematic plan view which mounted the second semiconductor chip on the first semiconductor chip.
Figure 10:
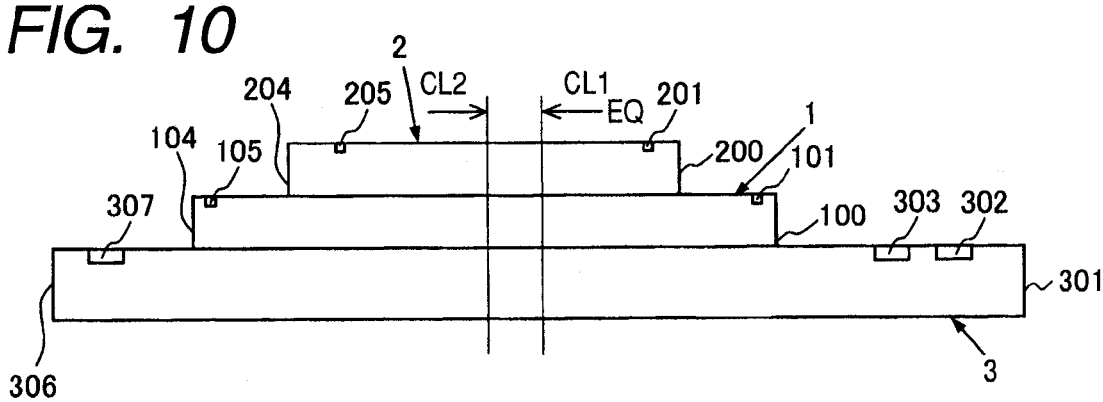
FIG. 10 is a schematic cross-sectional view which goes along the A-A' line of FIG. 9.

Next, at Step S3 of FIG. 4, as shown in FIG. 9 and FIG. 10, second semiconductor chip 2 is mounted via a binder (not shown) on first semiconductor chip 1. The integrated internal circuit (second circuit) is formed in the main surface of second semiconductor chip 2. A plurality of electrode pads 201, 203, and 205 electrically connected with the internal circuit via the wiring layer are formed, respectively along a plurality of sides 200, 202, and 204 of second semiconductor chip 2. Second semiconductor chip 2 is mounted on first semiconductor chip 1 at the position where the central line CL 2 is shifted from central line CL1 of the module substrate, in other words, so that it may overlap with central line CL 2 of first semiconductor chip 1. Thus, when laminating semiconductor chip 2 after the second stage, assembling property can be made easy in making the central line of each semiconductor chip 1 and 2 as a mark of alignment and laminating so that the central line of the semiconductor chip at the side of the upper row may overlap with the central line of the semiconductor chip at the side of a lower row.

Then, as shown in Step S4 of FIG. 4, the above-mentioned adhesives are hardened by doing baking processing of the module substrate 3 which mounted the first and second semiconductor chips 1 and 2 in heat atmosphere.

Figure 11:
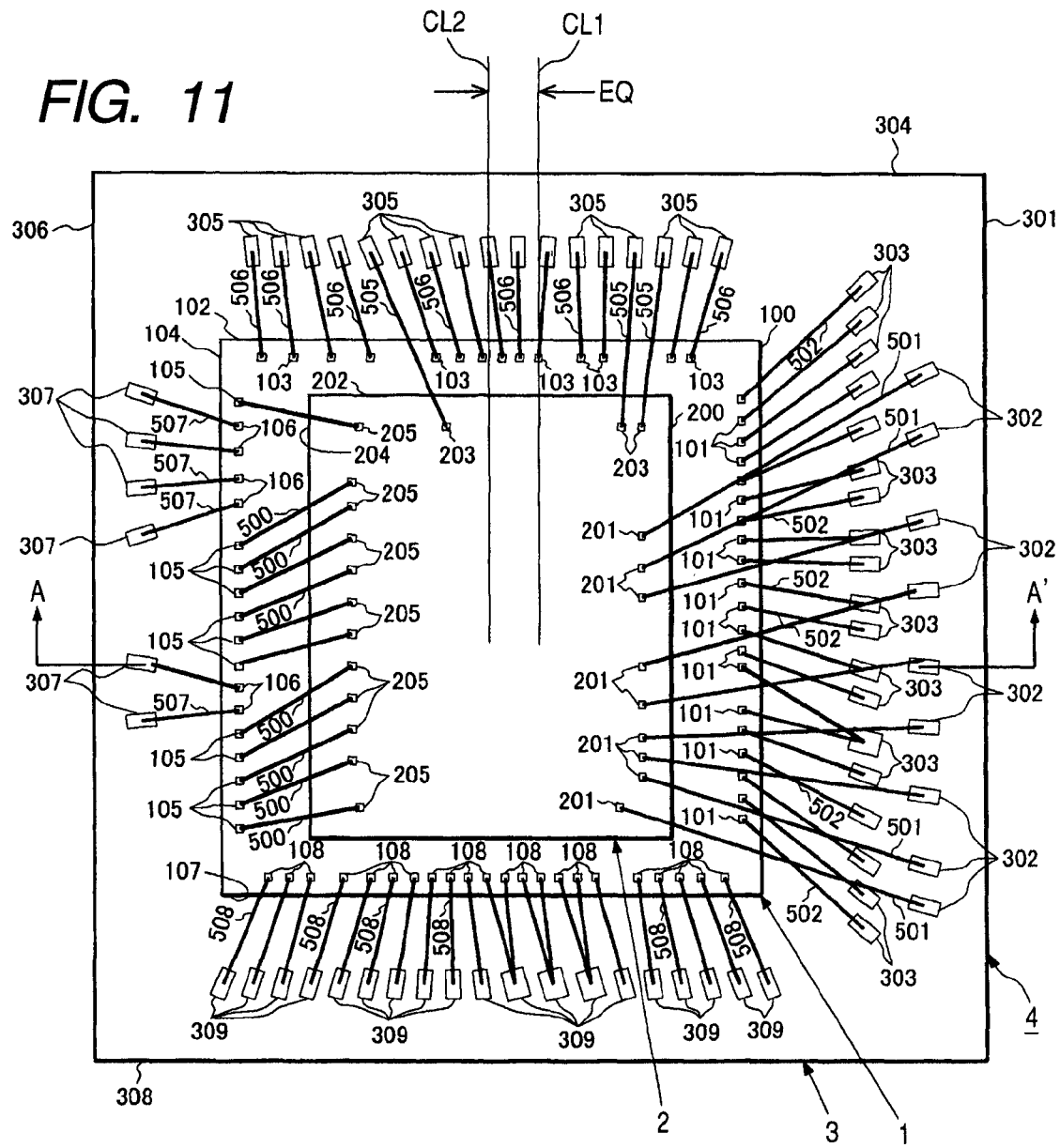
FIG. 11 is a schematic plan view which did wire bonding of each of the first and a second semiconductor chip, and the module substrate.
Figure 12:
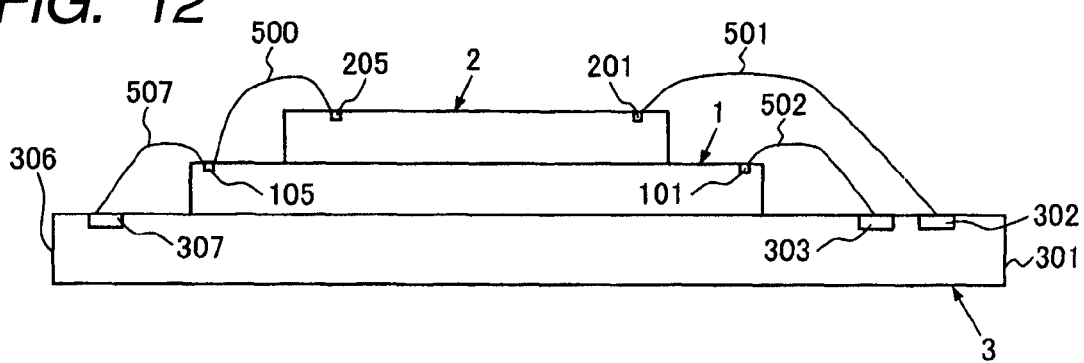
FIG. 12 is a schematic cross-sectional view which goes along the A-A' line of FIG. 11.

Next, in Step S5 and Step S6 of FIG. 4, as shown in FIG. 11 and FIG. 12, a plurality of electrode pads 101, 103, 105, 106, and 108 of first semiconductor chip 1 and a plurality of bonding leads 303, 305, 307, and 309 of module substrate 3 are electrically connected via a plurality of bonding wires 502, 506, 507, and 508 which consist of a conductive member, respectively. Then, a plurality of electrode pads 201 and 203 of second semiconductor chip 2, and a plurality of bonding leads 302, 305 of module substrate 3 are electrically connected, respectively by a plurality of bonding wires 501, 505 which consist of a conductive member. A plurality of electrode pads 205 of second semiconductor chip 2, and a plurality of electrode pads 105 of first semiconductor chip 1 are electrically connected, respectively by a plurality of bonding wires 500 which consist of a conductive member. When wire bonding of semiconductor chip 1 at the side of a lower row and module substrate 3 is performed after performing wire bonding of semiconductor chip 2 at the side of the upper row, and module substrate 3, the wire formed previously and the tip of the capillary which is a wire-bonding tool contact, and there is a possibility of causing a disconnection failure. Then, like the present invention, contact of a wire and a capillary can be suppressed by performing wire bonding of semiconductor chip 2 at the side of the upper row, and module substrate 3 after performing wire bonding of semiconductor chip 1 at the side of a lower row, and module substrate 3. This is because the loop shape of the wire formed later is located up rar than the loop shape of the wire formed previously.

Figure 13:
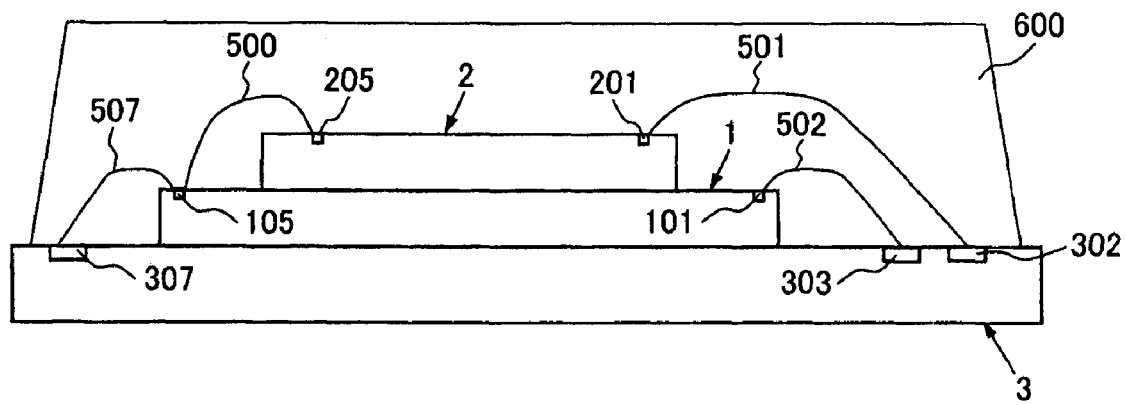
FIG. 13 is a schematic cross-sectional view which goes along the A-A' line of FIG. 11 in which the sealing body was formed on the module substrate.

Next, in Step S7 of FIG. 4, as shown in FIG. 13, the front surface side of module substrate 3, first semiconductor chip 1, second semiconductor chip 2, and a plurality of bonding wires 500, 501, 502, 505, 506, 507, and 508 are sealed by resin 600, and a sealing body is formed.

Figure 14:
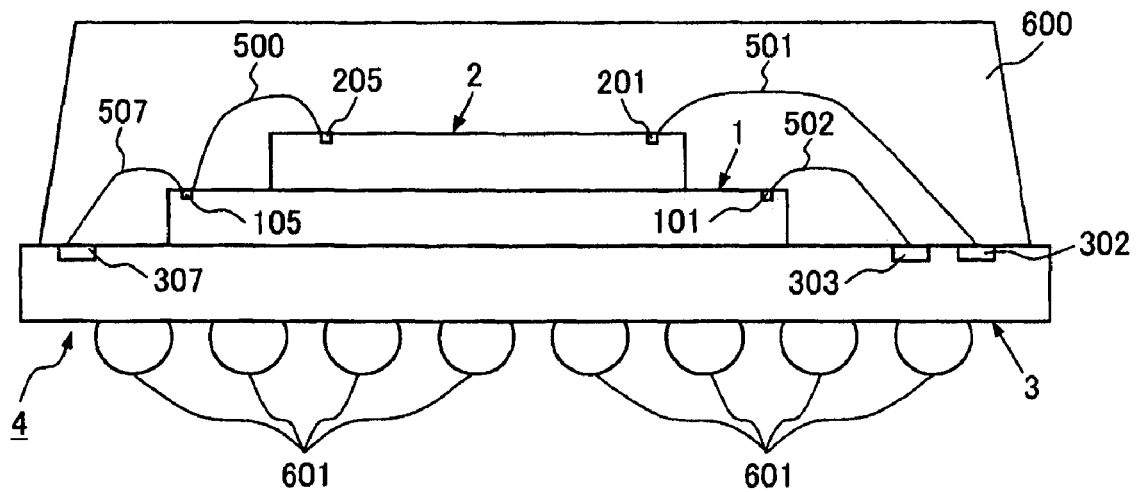
FIG. 14 is a schematic cross-sectional view where many ball electrodes have been arranged at the back surface of a module substrate and which goes along the A-A' line of FIG. 11.

Then, at Step S8 of FIG. 4, as shown in FIG. 14, many ball electrodes 601 are formed in the back surface side of module substrate 3. Although not illustrated, many ball electrodes 601 are electrically connected with a plurality of bonding leads 302, 303, 305, 307, and 309 currently formed on the front surface via the wiring layer formed in the internal layer of module substrate 3, respectively.

In the foregoing, the present invention accomplished by the present inventors is concretely explained based on above embodiments, but the present invention is not limited by the above embodiments, but variations and modifications may be made, of course, in various ways in the limit that does not deviate from the gist of the invention.

For example, the first and a second semiconductor chip are not limited to the timing controller and driver of a CCD camera. They may be the combination of others, such as the driver and display controller of a liquid crystal display, a memory and a memory controller, a microcomputer, a work memory. In the internal circuit of a semiconductor chip, the circuit configuration should just be determined according to the function of the semiconductor chip concerned.

It is not limited to a resin seal being done, for example by an individual mold method, but after mounting a plurality of semiconductor chips on the module substrate which has a plurality of product formation areas, respectively, a plurality of product formation areas may be put in block with a batch molding method (MAP), and a resin seal may be done. In that case, in an individual separation step, a plurality of product formation areas are cut and separated by the dicing blade, and the end portion of the sealing body of the semiconductor device acquired is formed in the same position as the end portion of a module substrate.

What is claimed is:

1. A semiconductor device comprising:
(a) a substrate having a main surface, a plurality of bonding leads formed on the main surface, and a back surface opposing to the main surface,
wherein a planar shape of the main surface of the substrate is a rectangular shape having a first side, and a second side opposing to the first side, and
wherein the plurality of bonding leads have a plurality of first bonding leads arranged along the first side, a plurality of second bonding leads arranged along the first side and arranged between the first side and the plurality of first bonding leads, and a plurality of third bonding leads arranged along the second side;
(b) a first semiconductor chip having a first main surface, a plurality of first electrode pads formed on the first main surface, a plurality of second electrode pads formed on the first main surface, and a first back surface opposing to the first main surface, and mounted on the main surface of the substrate such that the first semiconductor chip is arranged between the plurality of first bonding leads and the plurality of third bonding leads in a plan view,
wherein a planar shape of the first main surface of the first semiconductor chip is a rectangular shape having a third side adjacent to the first side of the substrate, and a fourth side opposing to the third side,
wherein the plurality of first electrode pads are arranged along the third side of the first semiconductor chip, and
wherein the plurality of second electrode pads are arranged along the fourth side of the first semiconductor chip;
(c) a second semiconductor chip having a second main surface, a plurality of third electrode pads formed on the second main surface, a plurality of fourth electrode pads formed on the second main surface, and a second back surface opposing to the second main surface, and mounted on the first main surface of the first semiconductor chip such that the second semiconductor chip is arranged between the plurality of first electrode pads and the plurality of second electrode pads in a plan view,
wherein a planar shape of the second main surface of the second semiconductor chip is a rectangular shape having a fifth side next to the third side of the first semiconductor chip, and a sixth side opposing to the fifth side,
wherein the plurality of third electrode pads are arranged along the fifth side of the second semiconductor chip, and
wherein the plurality of fourth electrode pads are arranged along the sixth side of the second semiconductor chip;
(d) a plurality of first wires electrically connecting the plurality of first electrode pads with the plurality of first bonding leads, respectively;
(e) a plurality of second wires electrically connecting the plurality of third electrode pads with the plurality of second bonding leads, respectively;
(f) a plurality of third wires electrically connecting a plurality of fifth electrode pads of the plurality of second electrode pads with the plurality of third bonding leads, respectively;
(g) a plurality of fourth wires electrically connecting the plurality of fourth electrode pads with a plurality of sixth electrode pads of the plurality of second electrode pads, respectively; and
(h) a sealing body sealing the first semiconductor chip, the second semiconductor chip, the plurality of first wires, the plurality of second wires, the plurality of third wires, and the plurality of fourth wires;
wherein a distance between the first side of the substrate and the third side of the first semiconductor chip is larger than that between the second side of the substrate and the fourth side of the first semiconductor chip;
wherein a center of the second semiconductor chip is shifted more toward the second side of the substrate from a center of the substrate and a center between the plurality of second bonding leads and the plurality of third bonding leads than the first side of the substrate in a plan view;
wherein a position of the center of the substrate is substantially the same as a position of the center between the plurality of second bonding leads and the plurality of third bonding leads;
wherein the plurality of fifth electrode oads are only electrically connected with the plurality of third bonding leads via the plurality of third wires, respectively; and wherein the plurality of sixth electrode pads are only electrically connected with the plurality of fourth electrode pads via the plurality of fourth wires, respectively.

2. The semiconductor device according to claim 1, wherein a size of each of the plurality of fifth electrode pads is the same as a size of each of the plurality of sixth electrode pads.

3. The semiconductor device according to claim 1, wherein a center portion of the first semiconductor chip is shifted more toward the second side of the substrate from a center portion of the substrate than the first side of the substrate in a plan view.

4. The semiconductor device according to claim 1, wherein a plurality of ball electrodes are formed on the back surface of the substrate.

5. The semiconductor device according to claim 1, wherein the first semiconductor chip is a timing controller generating a timing control signal controlling an operation of a CCD camera; and wherein the second semiconductor chip is a driver outputting a driver voltage to the CCD camera.

* * * * *